(12) United States Patent
Imahori

(10) Patent No.: US 9,258,933 B2
(45) Date of Patent: Feb. 9, 2016

(54) WIRE HARNESS

(71) Applicant: Hitachi Metals, Ltd., Tokyo (JP)

(72) Inventor: Masaaki Imahori, Hitachinaka (JP)

(73) Assignee: HITACHI METALS, LTD., Tokyo (JP)

( * ) Notice: Subject to any disclaimer, the term of this patent is extended or adjusted under 35 U.S.C. 154(b) by 21 days.

(21) Appl. No.: 14/140,733

(22) Filed: Dec. 26, 2013

(65) Prior Publication Data

US 2014/0182921 A1 Jul. 3, 2014

(30) Foreign Application Priority Data

Dec. 28, 2012 (JP) ................. 2012-287153

(51) Int. Cl.
*H05K 9/00* (2006.01)
*H01F 17/06* (2006.01)
*H04B 3/36* (2006.01)

(52) U.S. Cl.
CPC .............. *H05K 9/0007* (2013.01); *H01F 17/06* (2013.01); *H04B 3/36* (2013.01); *H05K 9/0066* (2013.01); *H01F 2017/065* (2013.01)

(58) Field of Classification Search
CPC ......................... H05K 9/0066; H01F 2017/065
USPC ................................................. 174/359, 360
See application file for complete search history.

(56) References Cited

U.S. PATENT DOCUMENTS

| | | | |
|---|---|---|---|
| 5,373,277 A | | 12/1994 | Naito |
| 5,416,673 A | * | 5/1995 | Toshimitsu ............ H05K 9/0066 174/359 |
| 5,486,803 A | | 1/1996 | Igarashi et al. |
| 5,917,148 A | * | 6/1999 | Woehl ............... H01R 13/5804 174/135 |
| 5,994,979 A | | 11/1999 | Taketomi et al. |
| 6,023,023 A | * | 2/2000 | Takeuchi ............ H03H 1/0007 174/92 |
| 6,080,262 A | * | 6/2000 | Wang ................ B29C 45/14598 156/245 |
| 6,125,044 A | * | 9/2000 | Cherniski et al. ............. 361/799 |
| 8,599,575 B1 | * | 12/2013 | McNally ....................... 361/818 |
| 2004/0173369 A1 | * | 9/2004 | Cherniski et al. ............... 174/36 |
| 2005/0162234 A1 | * | 7/2005 | Kobayashi .......... C04B 35/2625 331/181 |
| 2005/0285708 A1 | * | 12/2005 | Berens ................. H01F 27/255 336/212 |
| 2006/0021787 A1 | | 2/2006 | Fetterolf, Sr. et al. |
| 2006/0053622 A1 | | 3/2006 | Ueda et al. |

(Continued)

FOREIGN PATENT DOCUMENTS

| | | |
|---|---|---|
| DE | 4201926 | 8/1992 |
| EP | 1039632 | 9/2000 |

(Continued)

OTHER PUBLICATIONS

Extended European Search Report Application No. 13199750.4-1556 dated May 8, 2014.

(Continued)

*Primary Examiner* — Hung V Ngo
(74) *Attorney, Agent, or Firm* — Roberts Mlotkowski Safran & Cole P.C.

(57) ABSTRACT

A wire harness includes an electric wire, a braided shield covering the electric wire, an annular electromagnetic wave absorption component that includes a through-hole for inserting electric wire and absorbs electromagnetic wave emitted from the electric wire, and a movement-restricting member for restricting the electromagnetic wave absorption component from moving in a direction of inserting the electric wire in the through-hole.

6 Claims, 8 Drawing Sheets

(56) References Cited

U.S. PATENT DOCUMENTS

| | | | |
|---|---|---|---|
| 2006/0137891 A1* | 6/2006 | Berens | H01F 17/06 |
| | | | 174/36 |
| 2006/0232354 A1 | 10/2006 | Gilliland | |
| 2007/0120635 A1 | 5/2007 | Kobayashi | |
| 2008/0060841 A1* | 3/2008 | Bolouri-Saransar | H01B 11/16 |
| | | | 174/350 |
| 2008/0213615 A1* | 9/2008 | Kino | H01F 27/255 |
| | | | 428/596 |
| 2009/0120681 A1* | 5/2009 | Matsuzaki | H01F 17/06 |
| | | | 174/350 |
| 2013/0068518 A1 | 3/2013 | Kato et al. | |
| 2013/0085402 A1* | 4/2013 | Callahan | A61B 5/0402 |
| | | | 600/509 |
| 2013/0342300 A1* | 12/2013 | Nagata | H01F 17/06 |
| | | | 336/175 |

FOREIGN PATENT DOCUMENTS

| | | |
|---|---|---|
| GB | 2282707 | 4/1995 |
| JP | 09-035940 A | 2/1997 |
| JP | 2000-151175 A | 5/2000 |
| JP | 2002-198680 A | 7/2002 |
| JP | 2003-078275 A | 3/2003 |
| JP | 2005-223212 A | 8/2005 |
| JP | 2011254613 | 12/2011 |
| WO | 2008063593 | 5/2008 |
| WO | 2012098394 | 7/2012 |

OTHER PUBLICATIONS

European office action Application No. 13 199 750.4 dated Jul. 8, 2015.

Japanese Office Action dated Oct. 6, 2015 and English translation of notification of reasons for refusal.

* cited by examiner

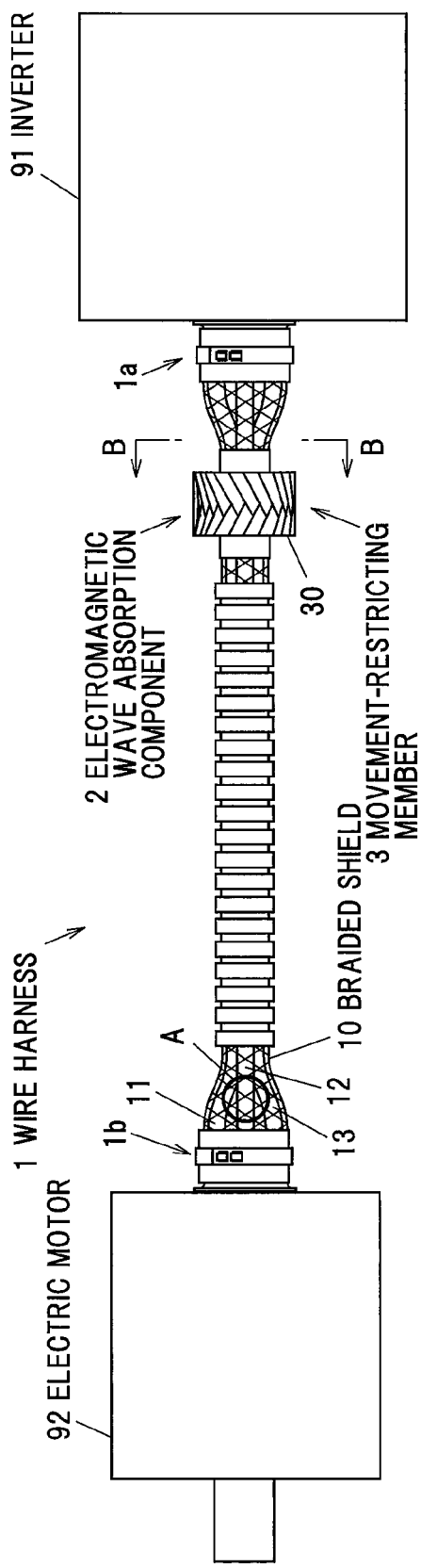
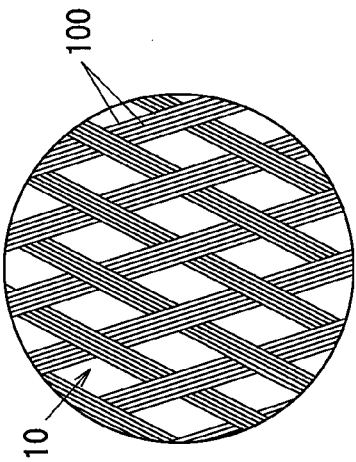
FIG.1A
FIG.1B

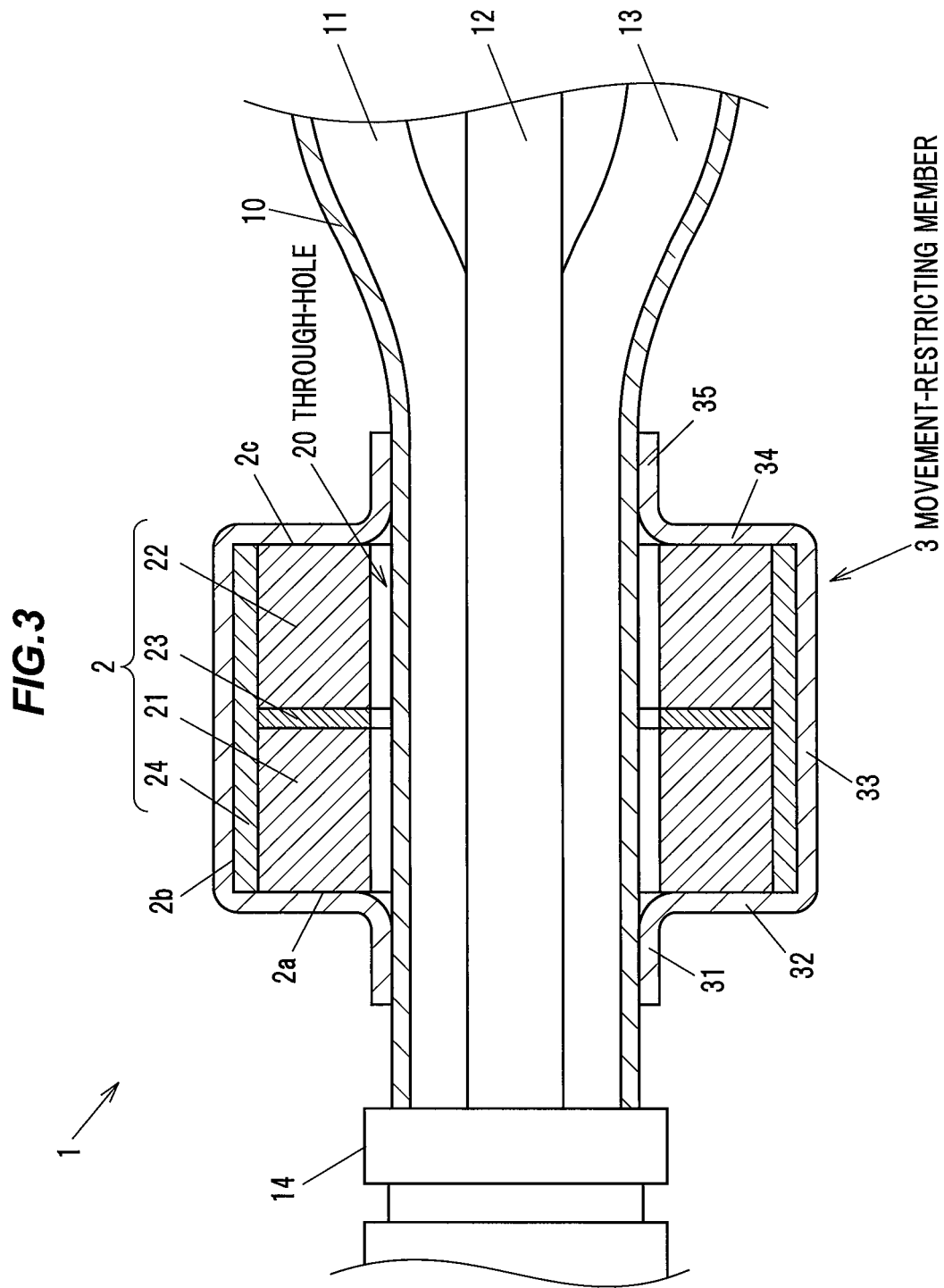

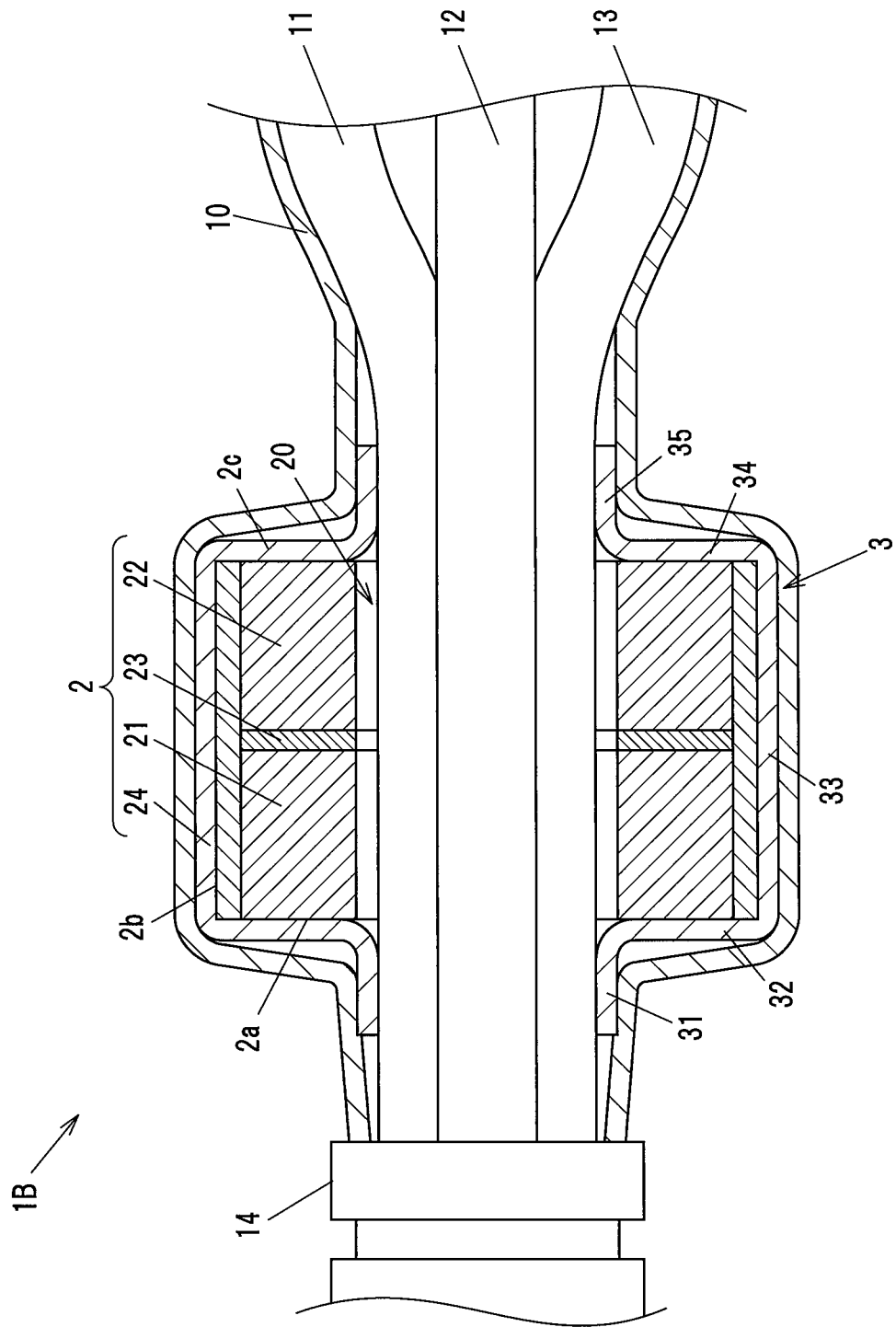

WIRE HARNESS

The present application is based on Japanese patent application No. 2012-287153 filed on Dec. 28, 2012, the entire contents of which are incorporated herein by reference.

BACKGROUND OF THE INVENTION

1. Field of the Invention

The invention relates to a wire harness and, in particular, to a wire harness provided with a magnetic core for reducing an electromagnetic noise.

2. Description of the Related Art

A wire harness is known that is used for e.g. a vehicle having an electric motor as a drive source so as to connect the electric motor with an inverter. The wire harness is provided with a braided shield so as to reduce the electromagnetic noise emitted from electric wires of the wire harness (See e.g. JP-A-2011-254613).

A wire harness disclosed in JP-A-2011-254613 is provided with three electric wires and a braided shield covering the three electric wires. A shield shell is provided at both ends of the three electric wires and the outer surface of the shield shell is partially covered with the expanded end portions of the braided shield.

SUMMARY OF THE INVENTION

Recent information-processing equipment is likely to be affected by an electromagnetic noise due to its high integration and high processing speed. Therefore, the wire harness disposed near the information-processing equipment needs to further reduce the electromagnetic noise emitted therefrom. In order to reduce the electromagnetic noise emitted from wire harnesses, the inventors have proposed using a magnetic core such as a ferrite core as well as the braided shield.

However, when the wire harness with the magnetic core is used under the vibration environment as in vehicles, it is found that the friction between the braided shield and the magnetic core causes abrasion of the braided shield. The abrasion of the braided shield may cause the breakage of shield wires in long-term use and may accordingly reduce the shield function of the braided shield.

It is an object of the invention to provide a wire harness that the electromagnetic noise can be reduced while preventing the abrasion of the braided shield covering the electric wires.

(1) According to one embodiment of the invention, a wire harness comprises:

an electric wire;

a braided shield covering the electric wire;

an annular electromagnetic wave absorption component that comprises a through-hole for inserting electric wire and absorbs electromagnetic wave emitted from the electric wire; and a movement-restricting member for restricting the electromagnetic wave absorption component from moving in a direction of inserting the electric wire in the through-hole.

Effects of the Invention

According to one embodiment of the invention, a wire harness can be provided that the electromagnetic noise can be reduced while preventing the abrasion of the braided shield covering the electric wires.

BRIEF DESCRIPTION OF THE DRAWINGS

Next, the present invention will be explained in more detail in conjunction with appended drawings, wherein:

FIGS. 1A and 1B show a wire harness in a first embodiment of the present invention and also an inverter and an electric motor which are connected by the wire harness, wherein FIG. 1A is an overall view and FIG. 1B is an enlarged view of a section A in FIG. 1A;

FIGS. 2A and 2B show a first wire holding portion, wherein FIG. 2A is an external view and FIG. 2B is an exploded view thereof;

FIG. 3 is a cross sectional view showing the wire harness in the periphery of an electromagnetic wave absorption component and a movement-restricting member;

FIG. 8 is a cross sectional view showing a wire harness in a third embodiment.

DETAILED DESCRIPTION OF THE PREFERRED EMBODIMENTS

First Embodiment

Figure 2A:
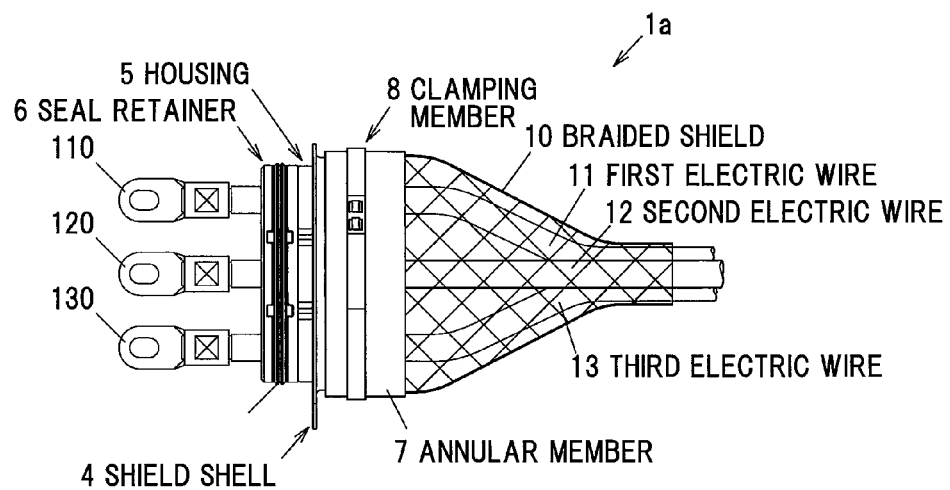

FIG. 1 shows a wire harness 1 in the embodiment of the invention and also an inverter 91 and an electric motor 92 which are connected by the wire harness 1, wherein FIG. 1A is an overall view and FIG. 1B is an enlarged view of a section A in FIG. 1A.

The wire harness 1 is installed in, e.g., a vehicle to supply an electric current, which is output from the inverter 91 under PMW (Pulse Width Modulation) control, to the electric motor 92 as a drive source for running the vehicle. The electric current contains harmonic components produced by switching a state of a switching element such as power transistor.

On the wire harness 1, a first wire holding portion 1a to be fixed to a case of the inverter 91 is provided at one end portion and a second wire holding portion 1b to be fixed to a case of the electric motor 92 is provided at another end portion. In addition, the wire harness 1 is provided with plural (three) electric wires (first to third electric wires 11 to 13) for supplying three-phase alternating current of U-phase, V-phase and W-phase to the electric motor 92, a tubular braided shield 10 covering the first to third electric wires 11 to 13, a corrugated tube 14, an annular electromagnetic wave absorption component 2 through which the first to third electric wires 11 to 13 are inserted, and a movement-restricting member 3 for restricting movement of the electromagnetic wave absorption component 2. Note that, the electromagnetic wave absorption component 2 and the first wire holding portion 1a are separated with a predetermined distance (not less than 10 cm and not more than 50 cm).

The movement-restricting member 3 is formed by winding a resin tape 30 as a tape member. In FIG. 1, the entire electromagnetic wave absorption component 2 is covered with the movement-restricting member 3. The details of the electromagnetic wave absorption component 2 and the movement-restricting member 3 (the resin tape 30) will be described later.

FIG. 1B is an enlarged view of the braided shield 10 in the section A of FIG. 1A. The braided shield 10 is composed of plural shield wires 100 each formed of, e.g., copper with tin plating. In the present embodiment, six shield wires 100 are bundled into one strand and such strands are braided by crossing in an X-shaped manner, thereby forming the braided shield 10. The inner diameter of the braided shield 10 can be enlarged or shrunk by, e.g., manually changing a size of mesh.

The corrugated tube 14 is a tubular member formed of resin and partially covers the first to third electric wires 11 to 13 and the braided shield 10. On the corrugated tube 14, large diameter portions and small diameter portions are alternately formed to increase flexibility.

The first wire holding portion 1a and the second wire holding portion 1b are configured in the same manner. Next, taking the first wire holding portion 1a for an example, the configuration thereof will be described in detail in reference to FIGS. 2A and 2B.

Figure 2B:
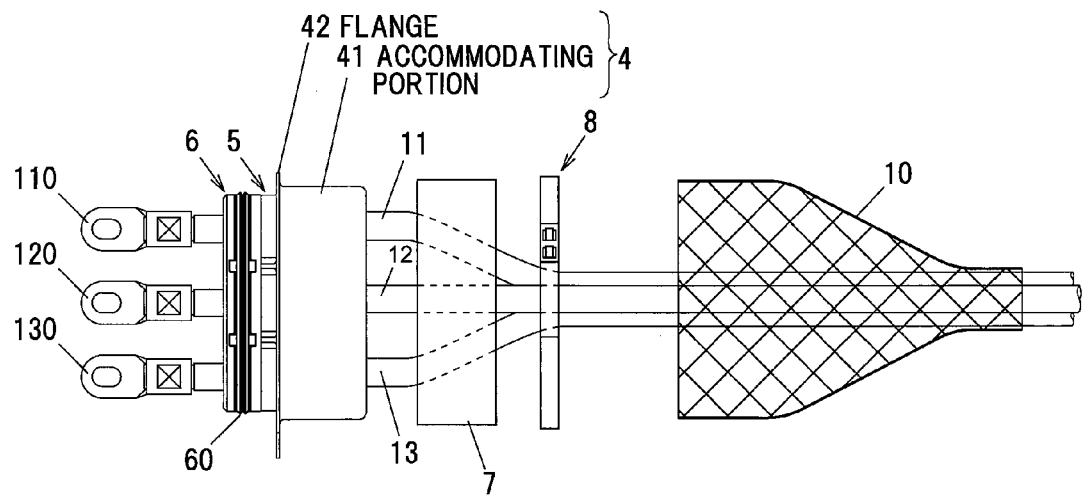

FIGS. 2A and 2B show the first wire holding portion 1a, wherein FIG. 2A is an external view and FIG. 2B is an exploded view thereof.

The first wire holding portion 1a is composed of a shield shell 4 formed of a conductive metal, a resin housing 5 partially housed in the shield shell 4 and holding the first to third electric wires 11 to 13, a seal retainer 6 coupled to the housing 5 and holding an annular sealing member 60, an annular member 7 arranged on an outer periphery of the braided shield 10 and a belt-like clamping member 8. Connecting terminals 110, 120 and 130 are connected to respective end portions of the first to third electric wires 11 to 13 by, e.g., crimping.

The shield shell 4 integrally has a cylindrical accommodating portion 41 accommodating a portion of the housing 5 and a flange 42 to be fixed to the case of the inverter 91. Non-illustrated bolt insertion holes are formed on the flange 42 and the shield shell 4 is fixed to the grounded case of the inverter 91 by bolts inserted through the bolt insertion holes.

The housing 5 has an insertion hole for inserting the first to third electric wires 11 to 13 and is fixed to the accommodating portion 41 of the shield shell 4 by, e.g., press-fitting. The sealing member 60 held by the seal retainer 6 seals a gap between the seal retainer 6 and an inner surface of a mounting hole formed on the case of the inverter 91.

The annular member 7 is, e.g., an acetate cloth tape and is annularly wound several times around the braided shield 10 so as to sandwich the braided shield 10 between itself and the accommodating portion 41 of the shield shell 4. The clamping member 8 is formed of, e.g., a metal such as stainless steel, is arranged on the outer periphery of the annular member 7 and tightens the annular member 7 by crimping.

Configurations of Electromagnetic Wave Absorption Component 2 and Movement-restricting Member 3

As shown in FIG. 1, the electromagnetic wave absorption component 2 is arranged around the first to third electric wires 11 to 13 at a portion exposed from the corrugated tube 14 in the vicinity of the first wire holding portion 1a and is restricted from moving in a direction along the first to third electric wires 11 to 13 by the movement-restricting member 3.

Figure 4:
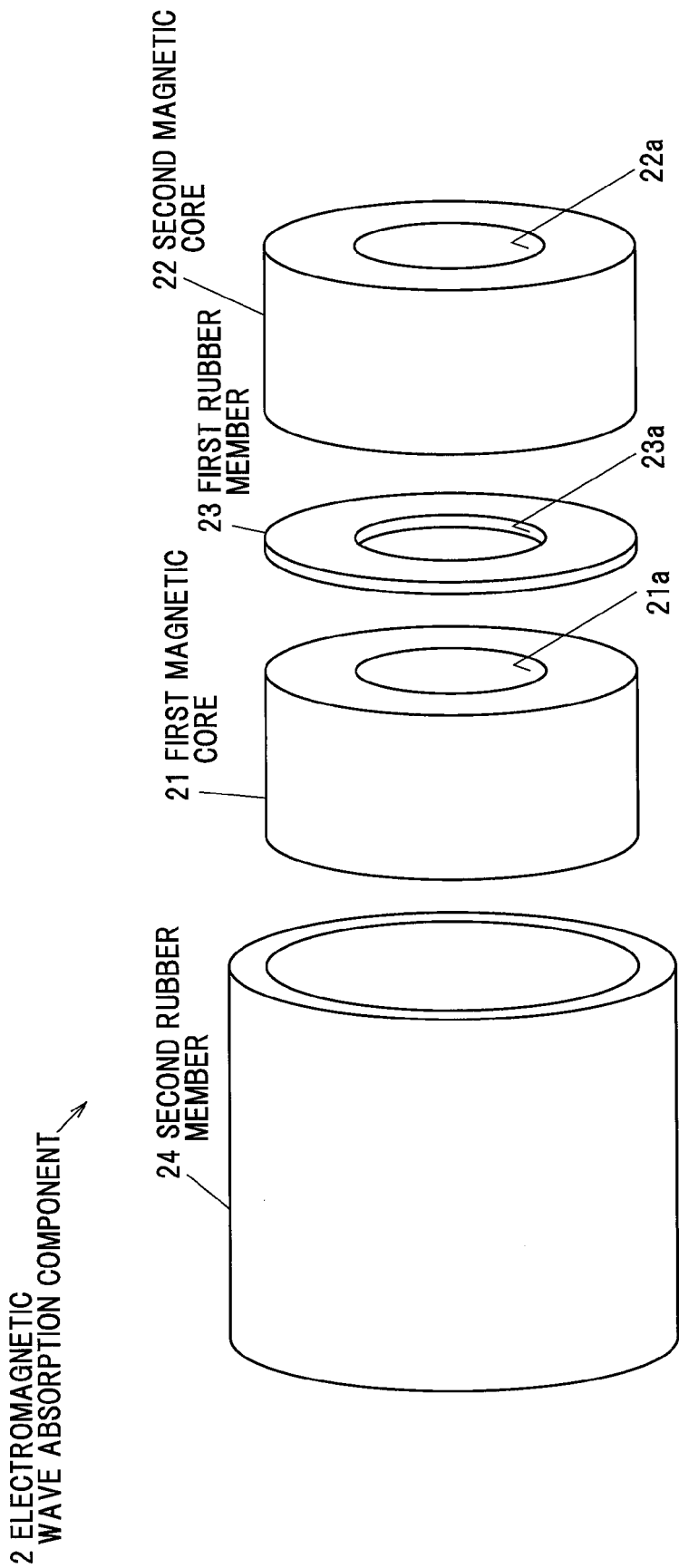
FIG. 4 is an exploded perspective view showing the electromagnetic wave absorption component.

FIG. 3 is a cross sectional view showing the wire harness 1 in the periphery of the electromagnetic wave absorption component 2 and the movement-restricting member 3. FIG. 3 shows the first to third electric wires 11 to 13 inside the electromagnetic wave absorption component 2, the movement-restricting member 3 and the braided shield 10 which are cut along an axial direction of the wire harness 1. FIG. 4 is an exploded perspective view showing the electromagnetic wave absorption component 2.

The electromagnetic wave absorption component 2 is provided with a first magnetic core 21, a second magnetic core 22, a first rubber member 23 and a second rubber member 24. A through-hole 20 for inserting the first to third electric wires 11 to 13 is formed in the middle of the electromagnetic wave absorption component 2. The through-hole 20 is formed by combining a through-hole 21a formed in the middle of the first magnetic core 21, a through-hole 22a formed in the middle of the second magnetic core 22 and a through-hole 23a formed in the middle of the first rubber member 23.

For the first magnetic core 21 and the second magnetic core 22, it is possible to use an annular core member having high magnetic permeability such as ferrite core, amorphous core or permalloy core. In the present embodiment, the first magnetic core 21 and the second magnetic core 22 are formed of soft ferrite exhibiting soft magnetic properties (e.g., manganese zinc ferrite, nickel zinc ferrite, copper zinc ferrite, etc.). Other than the above, it is also possible to use hexagonal ferrite (hard ferrite), garnet ferrite and cobalt ferrite. The first magnetic core 21 and the second magnetic core 22 are aligned along the axial direction of the wire harness 1. The first magnetic core 21 may be formed as an annular one-piece member or may be formed in an annular shape by combining, e.g., a pair of members having semicircular cross section. The same applies to the second magnetic core 22.

The first magnetic core 21 and the second magnetic core 22 absorb electromagnetic wave (electromagnetic noise) emitted from the first to third electric wires 11 to 13 and convert the electromagnetic energy into mechanical energy such as vibration or thermal energy. This reduces adverse effects of the electromagnetic wave emitted from the wire harness 1 on an information-processing equipment, etc., arranged therearound.

The first rubber member 23 is a plate-like annular member sandwiched and held by the first magnetic core 21 and the second magnetic core 22 and suppresses abrasion caused by vibration associated with electromagnetic wave absorption by the first magnetic core 21 and the second magnetic core 22 or vibration of a vehicle. The second rubber member 24 is a cylindrical member arranged around the first magnetic core 21 and the second magnetic core 22 so that the inner surface thereof faces the outer peripheral surfaces of the first magnetic core 21 and the second magnetic core 22. The first rubber member 23 and the second rubber member 24 are integrated with the first magnetic core 21 and the second magnetic core 22 by, e.g., adhesive bonding.

The first rubber member 23 and the second rubber member 24 function as a shock-absorbing material having higher elasticity than the first magnetic core 21 and the second magnetic core 22. The second rubber member suppresses abrasion, etc., of another member (the braided shield 10 in the present embodiment) arranged around the electromagnetic wave absorption component 2.

The movement-restricting member 3 restricts the electromagnetic wave absorption component 2 from moving in a direction of inserting the first to third electric wires 11 to 13 into the through-hole 20. In addition, the movement-restricting member 3 also restricts rotation of the electromagnetic wave absorption component 2 with respect to the first to third electric wires 11 to 13.

The movement-restricting member 3 is formed by winding a single resin tape 30 and integrally has first to fifth regions 31 to 35 shown in FIG. 3. The first region 31 is a region in which the resin tape 30 is wound around a portion on the outer periphery of the first to third electric wires 11 to 13 exposed from the through-hole 20 on the second wire holding portion 1b (shown in FIG. 1) side of the electromagnetic wave absorption component 2. The second region 32 is a region in which the resin tape 30 is stretched and attached (attached in a stretched manner) at a position facing a side surface 2a of the electromagnetic wave absorption component 2 on the second wire holding portion 1b side.

Then, the third region 33 is a region in which the resin tape 30 facing an outer peripheral surface 2b of the electromagnetic wave absorption component 2 is adhered to the outer periphery of the electromagnetic wave absorption component 2. The fourth region 34 is a region in which the resin tape 30 is stretched and attached at a position facing a side surface 2c of the electromagnetic wave absorption component 2 on the first wire holding portion 1a side. The fifth region 35 is a region in which the resin tape 30 is wound around a portion on the outer periphery of the first to third electric wires 11 to 13 exposed from the through-hole 20 on the first wire holding portion 1a (shown in FIG. 1) side of the electromagnetic wave absorption component 2.

In the first embodiment, the braided shield 10 is inserted, together with the first to third electric wires 11 to 13, through the through-hole 20 of the electromagnetic wave absorption component 2, and the resin tape 30 of the movement-restricting member 3 in the first region 31 and the fifth region 35 is wound around and in contact with the braided shield 10.

FIGS. 5A to 5F are explanatory diagrams illustrating an example of the procedure for winding the resin tape 30 around the first to third electric wires 11 to 13 and the electromagnetic wave absorption component 2 to fix the electromagnetic wave absorption component 2. The resin tape 30 has an adhesive layer formed on a surface of a belt-like resin member made of soft resin such as polyvinyl chloride and is wound with the adhesive layer facing inward.

Figure 5A:
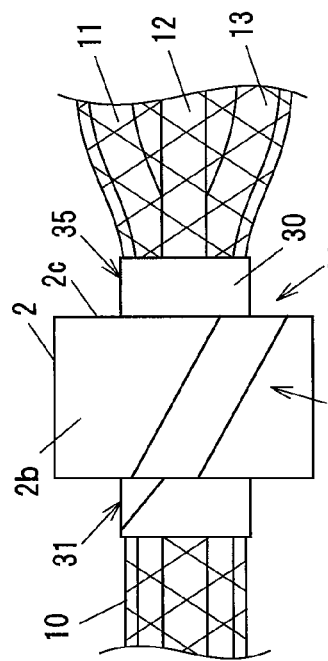
FIGS. 5A to 5F are explanatory diagrams illustrating an example of the procedure for winding a resin tape around first to third electric wires and the electromagnetic wave absorption component to fix the electromagnetic wave absorption component.

FIG. 5A shows a state before winding the resin tape 30. The electromagnetic wave absorption component 2 is arranged around the first to third electric wires 11 to 13 and around the braided shield 10. In this state, the electromagnetic wave absorption component 2 is movable in the axial direction of the first to third electric wires 11 to 13 (a horizontal direction in FIGS. 5A to 5F).

Figure 5B:
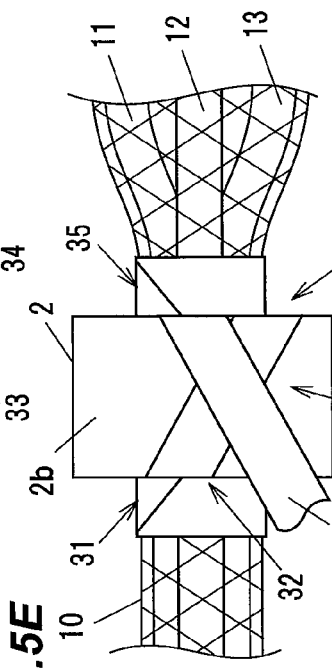

FIG. 5B shows a state in which the resin tape 30 is wound around a portion on the outer periphery of the first to third electric wires 11 to 13 exposed from the through-hole 20 on the second wire holding portion 1b side of the electromagnetic wave absorption component 2. The resin tape 30 here is to be the first region 31 of the movement-restricting member 3. The first region 31 restricts the electromagnetic wave absorption component 2 from moving toward the left side in FIG. 5A (toward one side in a longitudinal direction of the first to third electric wires 11 to 13).

Figure 5C:
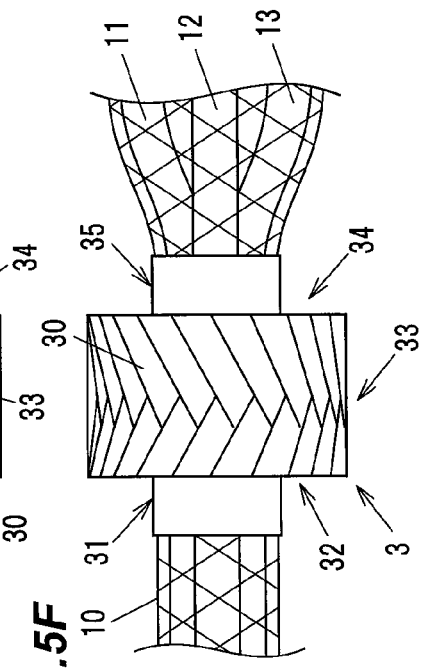

FIG. 5C shows a state in which the resin tape 30 pulled outward from the first region 31 is adhered to the outer periphery (the outer peripheral surface 2b) of the electromagnetic wave absorption component 2. A portion of the resin tape 30 on the outer periphery of the electromagnetic wave absorption component 2 is inclined with respect to a direction parallel to the axial direction of the first to third electric wires 11 to 13. A portion of the resin tape 30 facing the side surface 2a of the electromagnetic wave absorption component 2 is to be the second region 32 of the movement-restricting member 3. The resin tape 30 on the outer periphery of the electromagnetic wave absorption component 2 is to be the third region 33 of the movement-restricting member 3.

Figure 5D:
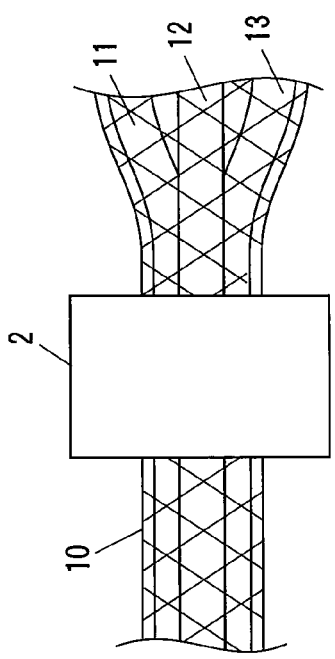

FIG. 5D shows a state in which the resin tape 30 is wound around a portion on the outer periphery of the first to third electric wires 11 to 13 exposed from the through-hole 20 on the first wire holding portion 1a side of the electromagnetic wave absorption component 2. The resin tape 30 here is to be the fifth region 35 of the movement-restricting member 3. The fifth region 35 restricts the electromagnetic wave absorption component 2 from moving toward the right side in FIG. 5A (toward another side in the longitudinal direction of the first to third electric wires 11 to 13). In addition, a portion of the resin tape 30 facing the side surface 2c of the electromagnetic wave absorption component 2 and extending from the outer edge of the electromagnetic wave absorption component 2 to the fifth region 35 is to be the fourth region 34 of the movement-restricting member 3. A winding direction of the resin tape 30 in the fifth region 35 is the same as that in the first region 31.

Figure 5E:
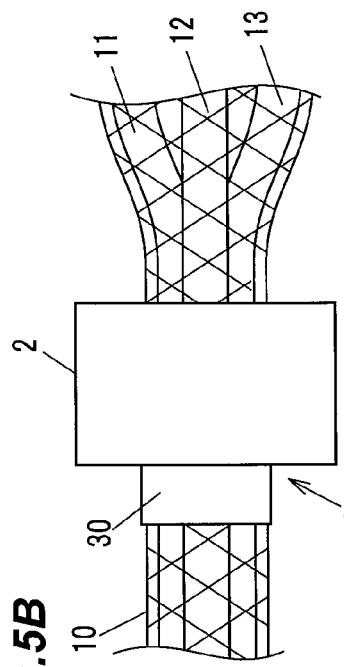

FIG. 5E shows a state in which the resin tape 30 pulled outward from the fifth region 35 is adhered to the outer periphery (the outer peripheral surface 2b) of the electromagnetic wave absorption component 2. The resin tape 30, which is pulled outward from the fifth region 35 and is adhered to the outer periphery of the electromagnetic wave absorption component 2, is inclined with respect to a direction parallel to the axial direction of the first to third electric wires 11 to 13 and a direction of the inclination is a direction crossing the resin tape 30 (see FIG. 5C) which is pulled outward from the first region 31 and is adhered to the outer periphery of the electromagnetic wave absorption component 2.

Figure 5F:
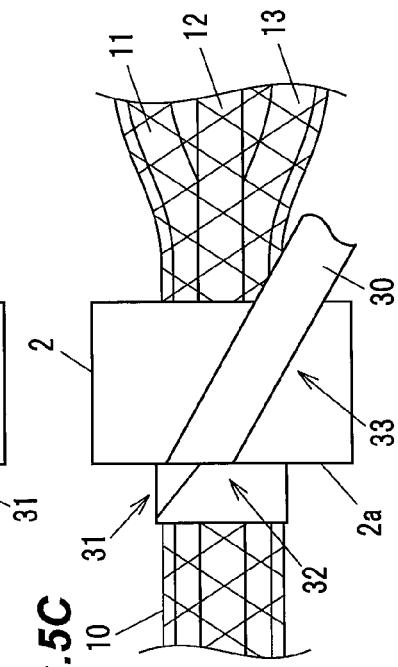

The resin tape 30 is wound in order as described in FIGS. 5A to 5E while the position of the resin tape 30 on the outer periphery of the electromagnetic wave absorption component 2 is gradually moved in a circumferential direction of the electromagnetic wave absorption component 2, and the entire electromagnetic wave absorption component 2 is thereby covered with the resin tape 30 as shown in FIG. 5F. As a result, movement of the electromagnetic wave absorption component 2 in the axial direction of the first to third electric wires 11 to 13 (a direction of inserting the first to third electric wires 11 to 13 into the through-hole 20) and rotation of the electromagnetic wave absorption component 2 with respect to the first to third electric wires 11 to 13 are restricted by the movement-restricting member 3.

Figure 6:
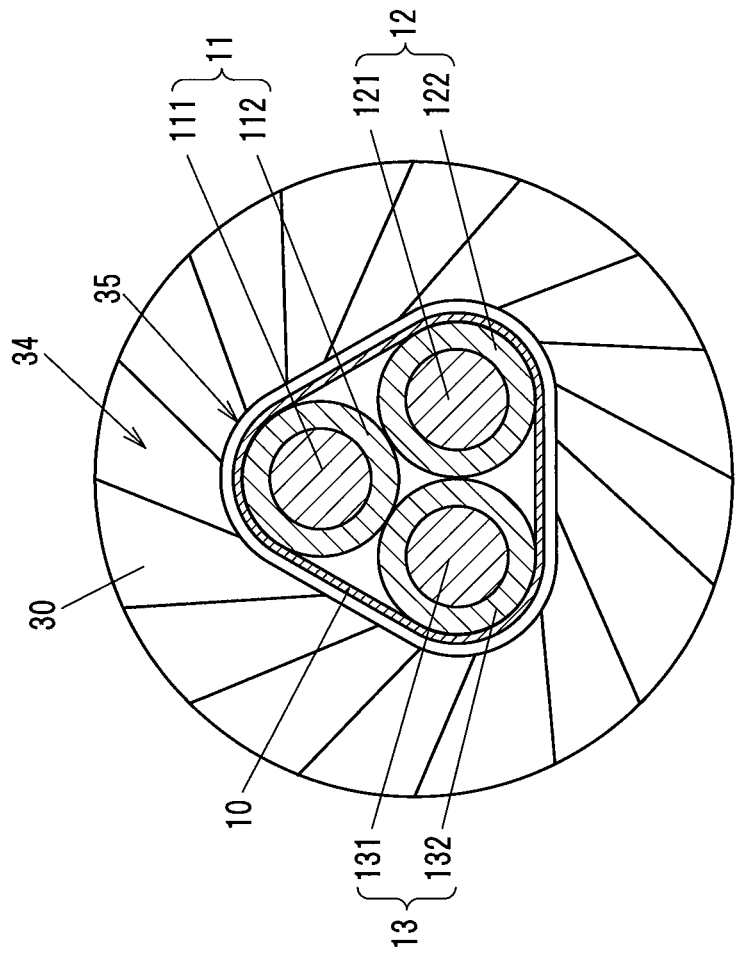
FIG. 6 is a cross sectional view showing the wire harness taken on line B-B of FIG. 1.

FIG. 6 is a cross sectional view showing the wire harness 1 taken on line B-B of FIG. 1. The first electric wire 11 is an insulated wire in which an outer periphery of a center conductor 111 formed of a high-conductive metal such as copper is covered with an insulation 112. Likewise, the second electric wire 12 is an insulated wire in which an outer periphery of a center conductor 121 is covered with an insulation 122, and the third electric wire 13 is an insulated wire in which an outer periphery of a center conductor 131 is covered with an insulation 132. The first to third electric wires 11 to 13 inserted through the through-hole 20 of the electromagnetic wave absorption component 2 are bundled by the movement-restricting member 3 in the first region 31 and the fifth region 35.

The resin tape 30 in the fourth region 34 is stretched and attached so as to extend in a radial direction of the electromagnetic wave absorption component 2 toward the lateral side of the fifth region 35. Note that, the resin tape 30 in the second region 32 is also stretched and attached so as to extend in the radial direction of the electromagnetic wave absorption component 2 toward the lateral side of the first region 31 in the same manner even though the illustration is omitted.

Functions and Effects of the Embodiment

The following functions and effects are obtained in the first embodiment.

(1) Since the movement-restricting member 3 restricts the electromagnetic wave absorption component 2 from moving in a direction of inserting the first to third electric wires 11 to 13 into the through-hole 20 of the electromagnetic wave absorption component 2, abrasion of the shield wires 100 caused by friction of the electromagnetic wave absorption component 2 against the braided shield 10 is suppressed. In other words, if the movement of the electromagnetic wave absorption component 2 is not restricted by the movement-restricting member 3, abrasion of the shield wires 100 is accelerated because, e.g., an opening edge of the through-hole 21a of the first magnetic core 21 and that of the through-hole 22a of the second magnetic core 22 come into contact with and rub against the braided shield 10 as the electromagnetic wave absorption component 2 moves in an axis direction of the through-hole 20, however, in the first embodiment, the movement of the electromagnetic wave absorption component 2 is restricted by the movement-restricting member 3 and this suppresses abrasion of the shield wires 100 of the braided shield 10 associated with the movement of the electromagnetic wave absorption component 2.

(2) The movement-restricting member 3 also restricts rotation of the electromagnetic wave absorption component 2, which further suppresses abrasion of the shield wires 100 caused by friction of the electromagnetic wave absorption component 2 against the braided shield 10.

(3) Since the movement-restricting member 3 is formed by winding the resin tape 30, it is possible to suppress the movement and rotation of the electromagnetic wave absorption component 2 easily and reliably while suppressing the cost.

(4) Since the movement-restricting member 3 includes the first region 31 and the fifth region 35 on both sides (the first wire holding portion 1a side and the second wire holding portion 1b side) of the electromagnetic wave absorption component 2, it is possible to reliably suppress movement and rotation of the electromagnetic wave absorption component 2. In addition, since the movement-restricting member 3 includes the third region 33 on the outer periphery of the electromagnetic wave absorption component 2 and the second region 32 and the fourth region 34 facing the side surfaces 2a and 2c of the electromagnetic wave absorption component 2, the resin tape 30 adhered to the outer peripheral surface 2b of the electromagnetic wave absorption component 2 in the third region 33 has tension in the second region 32 and the fourth region 34 and this allows movement and rotation of the electromagnetic wave absorption component 2 to be suppressed more reliably.

(5) Since movement of the electromagnetic wave absorption component 2 in the axial direction of the first to third electric wires 11 to 13 is restricted by the movement-restricting member 3, it is possible to prevent the electromagnetic wave absorption component 2 from hitting, e.g., an in-vehicle equipment (engine, steering system, vehicle body components, etc.) arranged therearound when assembling to a vehicle.

(6) Since the electromagnetic wave absorption component 2 has the second rubber member 24 which is arranged around the first magnetic core 21 and the second magnetic core 22, corners of the first magnetic core 21 and the second magnetic core 22 at edges of the outer peripheral surface 2b in an axial direction can be avoided from coming into contact with the movement-restricting member 3 (the resin tape 30), which suppresses breakage, etc., of the resin tape 30, thereby improving durability of the movement-restricting member 3.

Second Embodiment

Figure 7:
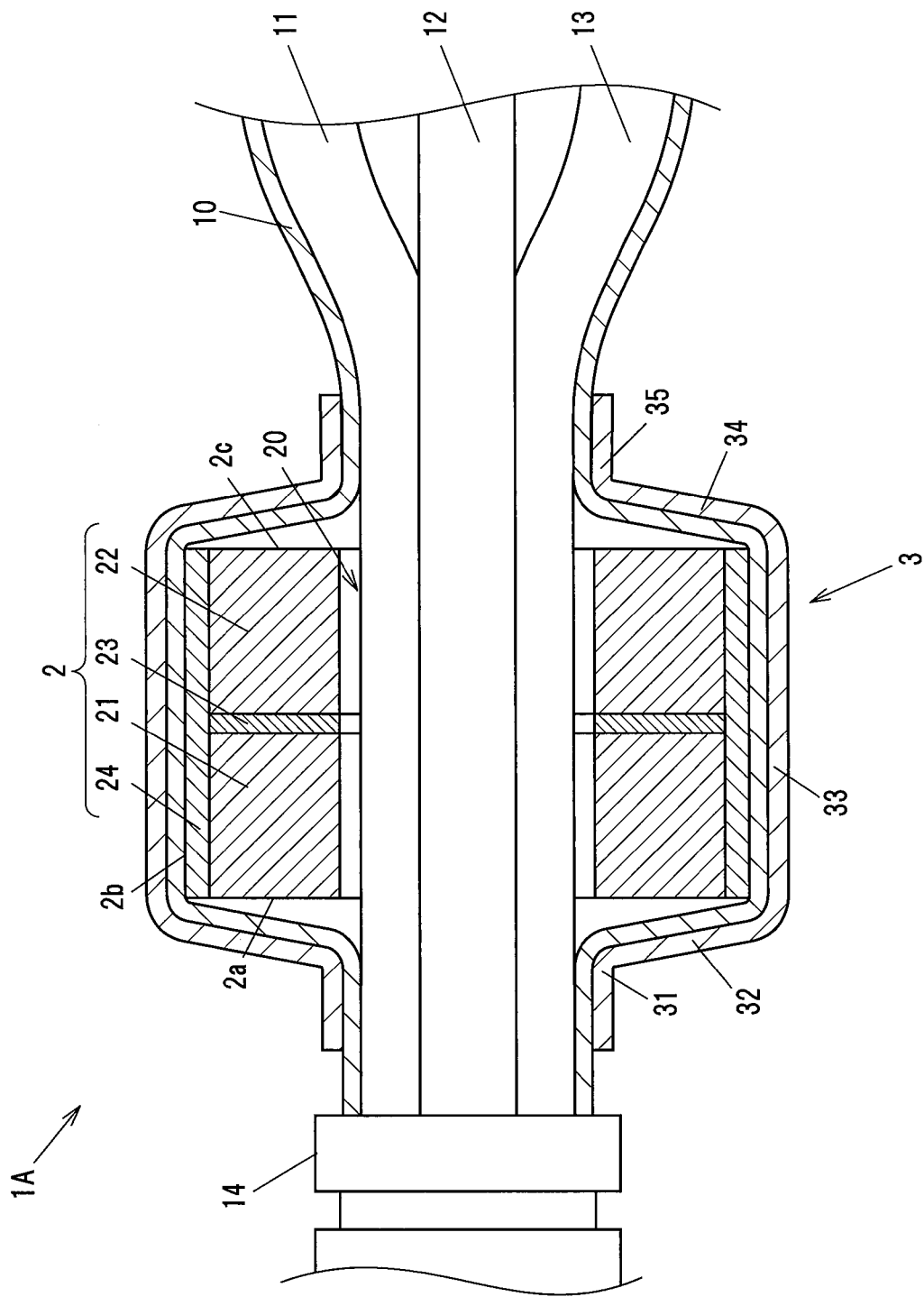
FIG. 7 is a cross sectional view showing a wire harness in a second embodiment.

Next, the second embodiment of the invention will be described in reference to FIG. 7. FIG. 7 is a cross sectional view showing a wire harness 1A in the periphery of the electromagnetic wave absorption component 2 and the movement-restricting member 3 in the second embodiment. In FIG. 7, constituent elements having the same functions as those described in the first embodiment are denoted by the same reference numerals and the overlapping explanation thereof will be omitted.

The first to third electric wires 11 to 13 and the electromagnetic wave absorption component 2 are covered with the braided shield 10 and the movement-restricting member 3 is arranged around the braided shield 10 in the wire harness 1A of the second embodiment, while the first to third electric wires 11 to 13 and the braided shield 10 are inserted through the through-hole 20 of the electromagnetic wave absorption component 2 in the wire harness 1 of the first embodiment.

In the second embodiment, the resin tape 30 of the movement-restricting member 3 in the first region 31 and the fifth region 35 is wound around and in contact with the braided shield 10 at portions on the outer periphery of the first to third electric wires 11 to 13 exposed from the through-hole 20 of the electromagnetic wave absorption component 2 on both sides (the first wire holding portion 1a side and the second wire holding portion 1b side) of the electromagnetic wave absorption component 2. In addition, the resin tape 30 of the movement-restricting member 3 in the third region 33 is wound around and in contact with the braided shield 10 on the outer periphery of the electromagnetic wave absorption component 2.

An adhesive layer of the resin tape 30 located on the inner side is adhered to the shield wires 100 and is also adhered to the outer peripheral surfaces of the first to third electric wires 11 to 13 and the outer peripheral surface 2b of the electromagnetic wave absorption component 2 through the mesh of the braided shield 10. The work procedure of winding the resin tape 30 is the same as that described for the first embodiment in reference to FIGS. 5A to 5F.

The second embodiment also achieves the same functions and effects as the functions and effects (1) to (5) described in the first embodiment. In addition, since the corners of the first magnetic core 21 and the second magnetic core 22 on the outer peripheral surface 2b can be avoided from coming into contact with the braided shield 10 by the presence of the second rubber member 24 of the electromagnetic wave absorption component 2, it is possible to further improve durability of the braided shield 10. Furthermore, since electromagnetic wave emitted from the first to third electric wires 11 to 13 is absorbed by the first magnetic core 21 and the second magnetic core 22 without interposition of the braided shield 10, it is possible to increase the amount of electromagnetic wave to be absorbed by the first magnetic core 21 and the second magnetic core 22.

Third Embodiment

Next, the third embodiment of the invention will be described in reference to FIG. 8. FIG. 8 is a cross sectional view showing a wire harness 1B in the periphery of the electromagnetic wave absorption component 2 and the movement-restricting member 3 in the third embodiment. In FIG. 8, constituent elements having the same functions as those described in the first embodiment are denoted by the same reference numerals and the overlapping explanation thereof will be omitted.

In the wire harness 1B of the third embodiment, the movement-restricting member 3 is arranged around the first to third electric wires 11 to 13 and the electromagnetic wave absorption component 2 and the braided shield 10 is further arranged around the movement-restricting member 3.

In the third embodiment, the resin tape 30 of the movement-restricting member 3 in the first region 31 and the fifth region 35 is wound around and in contact with portions of the first to third electric wires 11 to 13 exposed from the through-hole 20 of the electromagnetic wave absorption component 2. In addition, the resin tape 30 of the movement-restricting member 3 in the third region 33 is wound around the electromagnetic wave absorption component 2 so as to be in contact with the outer peripheral surface 2b. The work procedure of winding the resin tape 30 is the same as that described for the first embodiment in reference to FIGS. 5A to 5F.

The third embodiment also achieves the same functions and effects as the functions and effects (1) to (5) described in the first embodiment. In addition, since the electromagnetic wave absorption component 2 is not in contact with the braided shield 10 due to the movement-restricting member 3 interposed between the electromagnetic wave absorption component 2 and the braided shield 10, it is possible to suppress abrasion of the shield wires 100 more reliably.

Summary of the Embodiments

Technical ideas understood from the embodiments will be described below citing the reference numerals, etc., used for the embodiments. However, each reference numeral described below is not intended to limit the constituent elements in the claims to the members, etc., specifically described in the embodiments.

[1] A wire harness (1, 1A, 1B), comprising: electric wires (11 to 13); a braided shield (10) covering the electric wires (11 to 13); an annular electromagnetic wave absorption component (2) that has a through-hole (20) for inserting electric wires (11 to 13) and absorbs electromagnetic wave emitted from the electric wires (11 to 13); and a movement-restricting member (3) for restricting the electromagnetic wave absorption component (2) from moving in a direction of inserting the electric wires (11 to 13) into the through-hole (20).

[2] The wire harness (1, 1A, 1B) described in the [1], wherein the movement-restricting member (3) also restricts rotation of the electromagnetic wave absorption component (2) with respect to the electric wires (11 to 13).

[3] The wire harness (1, 1A, 1B) described in the [1] or [2], wherein the movement-restricting member (3) is a tape member (30) wound around a portion including the outer periphery of electric wires (11 to 13) exposed from the through-hole (20) on both sides of the electromagnetic wave absorption component (2).

[4] The wire harness (1, 1A, 1B) described in one of the [1] to [3], wherein the movement-restricting member (3) is a tape member (30) wound around a portion including the outer periphery of electric wires (11 to 13) exposed from the through-hole (20) on both sides of the electromagnetic wave absorption component (2) and the outer periphery of the electromagnetic wave absorption component (2).

[5] The wire harness (1A, 1B) described in one of the [1] to [4], wherein the braided shield covers the electric wires (11 to 13) and the electromagnetic wave absorption component (2).

[6] The wire harness (1A) described in the [5], wherein the movement-restricting member (3) is a tape member (30) wound around and in contact with the braided shield (10) on the outer periphery of electric wires (11 to 13) exposed from the through-hole (20) on both sides of the electromagnetic wave absorption component (2) and on the outer periphery of the electromagnetic wave absorption component (2).

[7] The wire harness (1A, 1B) described in the [5] or [6], wherein the electromagnetic wave absorption component (2) comprises annular magnetic cores (21, 22) for absorbing electromagnetic wave and a shock-absorbing material (24) having higher elasticity than the magnetic cores (21, 22) and arranged around the magnetic cores (21, 22).

[8] The wire harness (1) described in one of the [1] to [4], wherein the braided shield (10) is inserted, together with the electric wires (11 to 13), through the through-hole (20) of the electromagnetic wave absorption component (2).

Although the embodiments of the invention has been described, the invention according to claims is not to be limited to the above-mentioned embodiments. Further, please note that all combinations of the features described in the embodiments are not necessary to solve the problem of the invention.

In addition, the invention can be appropriately modified without departing from the gist of the invention. For example, although the wire harnesses 1, 1A and 1B having three electric wires (the first to third electric wires 11 to 13) have been described in the embodiments, it is not limited thereto. The number of electric wires may be, one, two, or four or more.

In addition, although the movement-restricting member 3 formed of a single resin tape 30 has been described in the embodiments, it is not limited thereto. The movement-restricting member 3 may be formed of, e.g., plural resin tapes 30. Alternatively, the movement-restricting member 3 may be a clip which is attached to the first to third electric wires 11 to 13 so as to sandwich the electromagnetic wave absorption component 2 from the both sides.

In addition, although the case where the entire electromagnetic wave absorption component 2 is covered with the resin tape 30 by winding the resin tape 30 several times around the first to third electric wires 11 to 13 and the electromagnetic wave absorption component 2 has been described in the embodiments, it is not limited thereto. It is possible to restrict relative movement of the electromagnetic wave absorption component 2 with respect to the first to third electric wires 11 to 13 as long as the resin tape 30 is wound at least once across the first to fifth regions 31 to 35. In this case, the resin tape 30 may not be necessarily wound a full circumference in the first region 31 and the fifth region 35. Furthermore, the movement-restricting member 3 may not need to have all of the first to fifth regions 31 to 35. The movement-restricting member 3 may have only, e.g., the first region 31 and the fifth region 35.

In addition, the intended use of the wire harnesses 1, 1A and 1B is not specifically limited.

What is claimed is:

1. A wire harness, comprising:
an electric wire;
an annular electromagnetic wave absorption component that comprises a through-hole for inserting electric wire and absorbs electromagnetic waves emitted from the electric wire;
a braided shield covering the electric wire and an outer periphery of the electromagnetic wave absorption component; and
an accommodating member accommodating a portion of the electric wire and a portion of the braided shield;
a movement-restricting member for restricting the electromagnetic wave absorption component from moving in a direction of inserting the electric wire in the through-hole,
wherein the electromagnetic wave absorption component is covered with the braided shield and exposed from the accommodating member,
wherein the movement-restricting member comprises a tape member wound around and in contact with the braided shield on an outer periphery of the electric wire on both sides of the electromagnetic wave absorption component exposed from the accommodating member and on the outer periphery of the electromagnetic wave absorption component.

2. The wire harness according to claim 1, wherein the movement-restricting member restricts a rotation of the electromagnetic wave absorption component relative to the electric wire.

3. The wire harness according to claim 2, further comprising:
- a first wire holding portion comprising a first shield shell comprising a conductive metal and covering around an end of the electric wire; and
- a second wire holding portion comprising a second shield shell comprising a conductive metal and covering around an other end of the electric wire,
- wherein the first shield shell and the second shield shell are connected to the braided shield.

4. The wire harness according to claim 1, wherein the electromagnetic wave absorption component comprises an annular magnetic core for absorbing electromagnetic wave and a shock-absorbing material having a higher elasticity than the magnetic core and arranged around the magnetic core.

5. The wire harness according to claim 1, wherein the braided shield is inserted, together with the electric wire, into the through-hole of the electromagnetic wave absorption component.

6. The wire harness according to claim 1, further comprising:
- a first wire holding portion comprising a first shield shell comprising a conductive metal and covering around an end of the electric wire; and
- a second wire holding portion comprising a second shield shell comprising a conductive metal and covering around an other end of the electric wire,
- wherein the first shield shell and the second shield shell are connected to the braided shield.

\* \* \* \* \*